United States Patent
Ichikawa et al.

(10) Patent No.: US 6,842,090 B2
(45) Date of Patent: Jan. 11, 2005

(54) SURFACE ACOUSTIC WAVE DEVICE UTILIZING OPPOSITE PROPAGATION DIRECTION REGIONS AND RESONANT MODE COUPLING

(75) Inventors: Satoshi Ichikawa, Tokyo (JP); Seiichi Mitobe, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/871,983

(22) Filed: Jun. 4, 2001

(65) Prior Publication Data

US 2001/0052737 A1 Dec. 20, 2001

Related U.S. Application Data

(63) Continuation of application No. PCT/JP00/06920, filed on Oct. 4, 2000.

(30) Foreign Application Priority Data

Oct. 4, 1999 (JP) .......................................... 11-283186

(51) Int. Cl.[7] .............................................. H03H 9/64
(52) U.S. Cl. ................................... 333/193; 310/313 B
(58) Field of Search ................................ 333/193–196; 310/313 B

(56) References Cited

U.S. PATENT DOCUMENTS

| | | | | |
|---|---|---|---|---|
| 4,733,207 A | * | 3/1988 | Peach | 333/193 |
| 5,392,013 A | * | 2/1995 | Yamamoto et al. | 333/195 |
| 5,475,348 A | * | 12/1995 | Hode et al. | 333/195 |
| 5,559,483 A | * | 9/1996 | Kajihara et al. | 333/195 |
| 5,646,584 A | * | 7/1997 | Kondratyev et al. | 333/193 |
| 5,663,696 A | * | 9/1997 | Morgan | 333/196 X |
| 5,896,071 A | * | 4/1999 | Dai et al. | 333/193 |
| 6,104,260 A | * | 8/2000 | Yamada et al. | 333/195 X |
| 6,147,574 A | * | 11/2000 | Kidoh | 333/195 |
| 6,462,633 B1 | * | 10/2002 | Ichikawa | 333/193 |
| 6,476,691 B1 | * | 11/2002 | Tsuzuki et al. | 333/193 |

FOREIGN PATENT DOCUMENTS

| | | |
|---|---|---|
| JP | 62-43204 | 2/1987 |
| JP | 63-266911 | 11/1988 |
| JP | 5-55863 | 3/1993 |
| JP | 6-232687 | 8/1994 |
| JP | 7-297669 | 11/1995 |
| JP | 8-204502 | 8/1996 |
| JP | 9-214284 | 8/1997 |
| JP | 10-294644 | * 11/1998 |
| JP | 11-266138 | 9/1999 |
| JP | 2001-53581 | 2/2001 |
| WO | WO 98/52281 | 11/1998 |

* cited by examiner

*Primary Examiner*—Barbara Summons
(74) *Attorney, Agent, or Firm*—Oblon, Spivak, McClelland, Maier & Neustadt, P.C.

(57) ABSTRACT

Transducers are connected in parallel on a piezoelectric substrate. Each of the transducers is constituted of RSPUDTs. The RSPUDTs include SPUDTs that are opposed to each other such that their propagation directions are opposite to each other. The SPUDTs have a unidirectional electrode structure having a propagation characteristic.

7 Claims, 8 Drawing Sheets

| RESONANCE FREQUENCY | Fl1 | Fl2 | Fc2 | Fc1 | Fu1 | Fu2 |
|---|---|---|---|---|---|---|
| PHASE RELATIONSHIP (SIGN) | + | − | + | − | + | − |

| RESONANCE FREQUENCY | Fl1 | Fl2 | Fc2 | Fc1 | Fu1 | Fu2 |
|---|---|---|---|---|---|---|
| PHASE RELATIONSHIP (SIGN) | − | + | − | + | − | + |

SURFACE ACOUSTIC WAVE DEVICE UTILIZING OPPOSITE PROPAGATION DIRECTION REGIONS AND RESONANT MODE COUPLING

CROSS-REFERENCE TO RELATED APPLICATIONS

This is a Continuation Application of PCT Application No. PCT/JP00/06920, filed Oct. 4, 2000, which was not published under PCT Article 21(2) in English.

This application is based upon and claims the benefit of priority from the prior Japanese Patent Application No. 11-283186, filed Oct. 4, 1999, the entire contents of which are incorporated herein by reference.

BACKGROUND OF THE INVENTION

This invention relates to a surface acoustic wave device including surface acoustic wave elements connected in parallel.

As is known, generally, a low loss and a steep out-of-band cutoff characteristic are required in a surface acoustic wave filter of a surface acoustic wave device used for mobile communication.

For example, a multistage cascade-connected resonant filter is used as a surface acoustic wave element for a system that requires a steep filter characteristic since a low loss is considered to be important and adjacent channels are close to each other though its frequency band is wide, like a GSM (Global System for Mobile Communication)—IF (Intermediate Frequency) filter.

In the multistage cascade-connected resonant filter, however, the number of stages needs to increase to secure steepness and thus a loss becomes large. In order to obtain a broad frequency band, tuning is needed between the stages of the respective resonant filters. The resonant filter is therefore difficult to mount.

Another structure of the surface acoustic wave filter is disclosed in, for example, Jpn. Pat. Appln. KOKAI Publications Nos. 62-43204 and 9-214284. In the surface acoustic wave filters of these publications, the frequency band can be broadened by frequency intervals of a multiplex mode of a resonator in each stage.

However, there is a limit to widen the passband of the above filters since multiple resonance frequency intervals chiefly depend upon the electromechanical coupling coefficient proper to a piezoelectric substrate. Unless the phase of an unnecessary higher-order mode outside the frequency band of the mode is set opposite to that of a resonant filter on the other party, the unnecessary higher-order mode cannot be suppressed. For this reason, the in-band characteristic cannot be designed virtually under the control of the out-of-band characteristic. The filters are therefore limited to their use.

In order to provide directivity with the propagation characteristic of a surface acoustic wave, a surface acoustic wave filter using a surface acoustic wave element R (Resonant) SPUDT (Single Phase Uni-Directional Transducer) has recently been used widely since it is high in flexibility of design, low in loss, and easy to miniaturize. In the surface acoustic wave element RSPUDT, SPUDTs of comb electrodes formed in a unidirectional electrode structure are arranged such that the main propagation directions of excitation waves are opposed to each other.

In this type of surface acoustic wave filter, however, the internal reflection of an electrode finger is positively used in order to achieve a unidirectional property. Both the bandwidth and skirt characteristic of the filter depend upon the ratio of a forward unidirectional electrode to a backward unidirectional electrode, the reflection factors thereof, and the number of electrode fingers. Therefore, there is a limit to designing the bandwidth and the skirt characteristic independently of each other. In particular, it is difficult to make a broad bandwidth and a steep skirt characteristic compatible with each other.

The present invention has been developed in consideration of the above situation and its object is to provide a surface acoustic wave device that requires a low loss, a broadband, and a steep skirt characteristic.

BRIEF SUMMARY OF THE INVENTION

A surface acoustic wave device according to the present invention comprises two or more transducers formed on a piezoelectric substrate and including a plurality of regions, each of the regions having a pair of comb electrodes whose surface wave propagation directions are opposite to each other, wherein at least two of the transducers are connected in parallel to each other.

The present inventors found that the frequency characteristics of a transducer, especially an interval between resonance points are varied by varying the ratio of a forward-direction SPUDT region to a backward-direction SPUDT region in the transducer (the ratio of the number of electrode fingers in the former SPUDT region to the number of electrode fingers in the latter SPUDT region).

In other words, the surface acoustic wave element using a transducer having an RSPUDT structure performs an intermediate operation between a known so-called transversal filter and a resonant filter, forms a resonant cavity whose end portion corresponds to the boundary between the forward-direction and backward-direction SPUDT regions in the transducer, shows a multiplex mode resonant frequency characteristic, and has a plurality of peaks (resonance points) on the frequency-amplitude characteristic.

In the filter with the RSPUDT structure, the resonant cavity length varies with the variation of the ratio of the number of electrode fingers of the forward-direction SPUDT in the transducer to the number of electrode fingers of the backward-direction SPUDT therein. Consequently, the resonant point on the frequency axis changes. It was found that the interval between the resonance points was expanded if the number of electrode fingers of the forward-direction SPUDT region of a transducer having an RSPUDT structure formed on a 45° X-Z lithium tetraborate (Li2B4O7: LBO) piezoelectric substrate was increased (if the ratio of the forward-direction SPUDT region was increased). With respect to the details of this respect, please see 1999 IEEE Ultrasonics Symposium Proceeding Vol. 1 pp 351 to 356.

Using this phenomenon, two (or more) RSPUDTs are connected in parallel and opposite phase, the resonance points of both the RSPUDTs are arranged on the frequency axis preferably at regular intervals to constitute a filter, and the outputs of the filter are subjected to impedance matching. A combined broad-passband characteristic can thus be obtained from the frequency characteristics of the two RSPUDTs. In this time, a desired passband characteristic can be achieved by controlling an interval between resonance points of the RSPUDTS. The interval can be controlled only by changing the ratio of the number of electrode fingers between the forward-direction SPUDT and the backward-direction SPUDT. It is thus possible to arrange the width of the passband relatively freely by slightly changing a design of the electrodes.

If one of the transducers connected in parallel has resonant frequencies of Fl1, Fc1 and Fu1 and the other transducer has resonant frequencies of Fl2, Fc2 and Fu2, these resonant frequencies are expressed as follows:

Fl1<Fl2<Fc2<Fc1<Fu1<Fu2.

Since, therefore, the phases of a low frequency close to the resonant frequency Fl1 and a high frequency close to the resonant frequency Fu2 are kept opposite to each other, the passband characteristics of both the transducers are cancelled out each other. A steep skirt characteristic can thus be achieved as an out-of-band characteristic.

The phases of the resonant frequencies Fl1 and Fl2 are opposite to each other, the phases of the resonant frequencies Fc1 and Fc2 are opposite to each other, and the phases of the resonant frequencies Fu1 and Fu2 are opposite to each other. A frequency band can thus be broadened.

The respective intervals of at least four of resonant frequencies Fl1, Fc1, Fu1, Fl2, Fc2 and Fu2, are almost equal to each other. A frequency band can thus be broadened.

The insertion losses of at least four of resonant frequencies Fl1, Fc1, Fu1, Fl2, Fc2 and Fu2 are almost equal to each other. A frequency band can thus be broadened irrespective of the frequencies.

Both of the transducers connected in parallel are formed on a single chip.

The transducers connected in parallel are formed on different chips.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
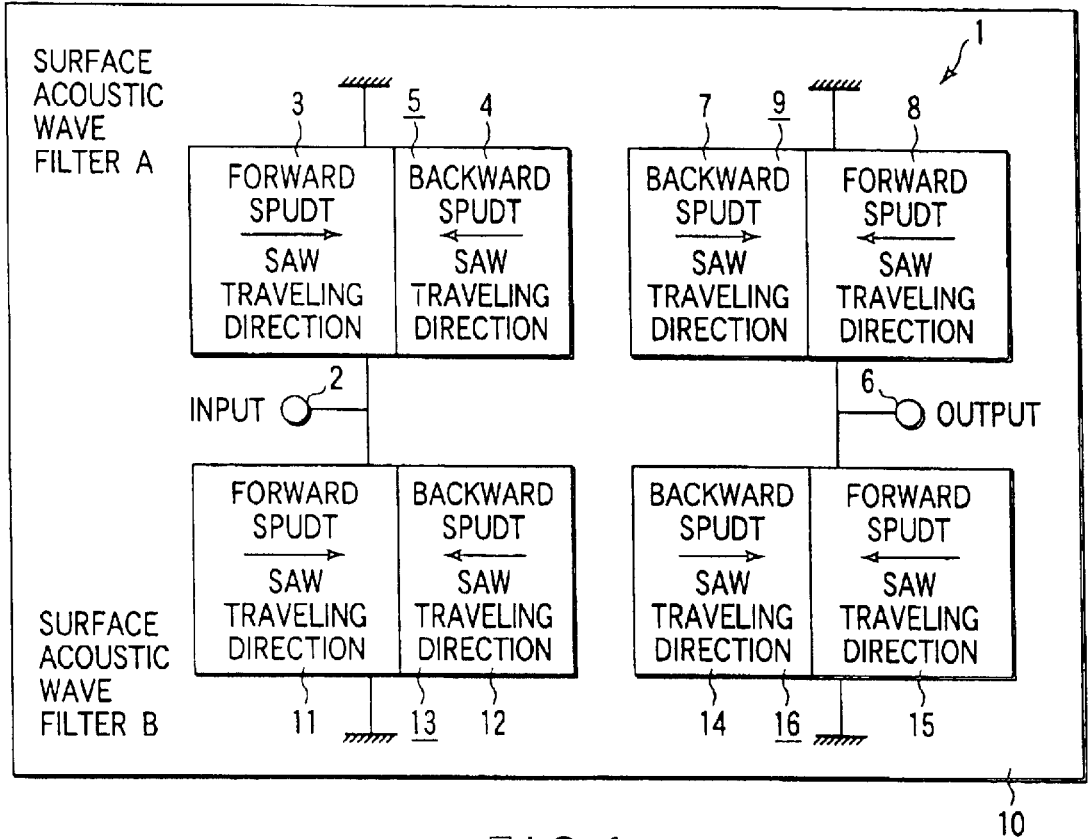
FIG. 1 is a view explaining and showing one embodiment of a surface acoustic wave device according to the present invention.

One embodiment of this invention will now be described in detail with reference to the drawings. In FIG. 1, reference numeral 1 indicates a surface acoustic wave device.

The surface acoustic wave device 1 is so constituted that a surface acoustic wave filter A of a first surface acoustic wave element and a surface acoustic wave filter B of a second surface acoustic wave element are connected in parallel on the same chip.

The surface acoustic wave filters A and B are each constituted of two of RSPUDTs 5, 9, 13 and 16 arranged in the main propagation direction of a surface acoustic wave. Assuming that the right traveling direction of a surface acoustic wave (SAW) in FIG. 1 is a forward direction and the left traveling direction thereof is a backward direction for the sake of convenience, the RSPUDTs include forward SPUDTs 3, 8, 11 and 15 for transmitting the SAW in the forward direction and backward SPUDTs 4, 7, 12 and 14 for transmitting the SAW in the backward direction.

Figure 2:
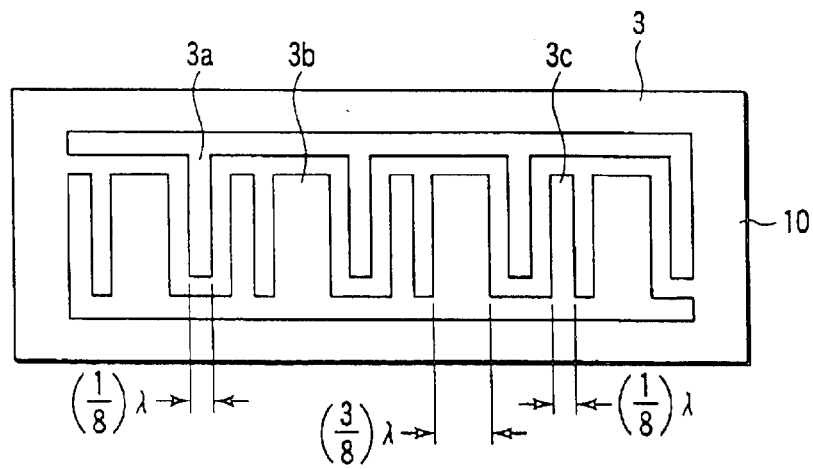
FIG. 2 is a plan view explaining and showing one example of a comb electrode structure of an SPUDT according to the embodiment of the present invention.

FIG. 2 shows an example of an SPUDT electrode structure. A pair of bus bars is formed on a piezo-electric substrate 10. An electrode finger 3a with a width of $\lambda/8$ ($\lambda$ is a wavelength of the surface wave) connected to one of the bus bars, and an electrode finger 3b with a width of $3\lambda/8$ and an electrode finger 3c with a width of $\lambda/8$ both are connected to the other bus bar are combined with each other into a comb electrode structure.

In the comb electrode structure, the phase relationship between an excitation wave and an internal reflection wave generated from an end portion of the electrode varies from the right direction to the left direction in FIG. 2. With the phase relationship, the excited surface acoustic wave is strengthened in one direction and weakened in the backward direction, with the result that a unidirectional property can be obtained.

In the present embodiment, two comb electrode structures into which the above comb electrode structure is folded symmetrically are arranged to constitute a single transducer. The RSPUDT structure is obtained accordingly.

The forward SPUDT and the backward SPUDT shown in FIG. 1 are constituted as one transducer having comb electrodes connected to a common bus bar. The electrodes are arranged symmetrically with regard to the boundary between the forward and backward SPUDTS.

In the present embodiment, the symmetric arrangement is not perfect. For example, the number of electrode fingers of the forward SPUDT and that of electrode fingers of the backward SPUDT do not always correspond to each other. As will be described later, the ratio of the number of electrode fingers between the forward and backward SPUDTS can be varied with a demanded characteristic.

One transducer need not be necessarily constituted of a single pair of forward and backward SPUDT regions. Some forward and backward SPUDT regions can be arranged in one transducer.

In constituting a filter in actuality, a desired filter characteristic is achieved by weighting the surface acoustic wave elements using a directional property. In many cases, the arrangement of forward and backward SPUDTS is more complicated. Therefore, the present invention is not limited to the RSPUDT structure shown in FIG. 1 but can be applied to such a complicated RSPUDT structure.

The filters A and B include a resonant cavity whose end coincides with the boundary between the forward and backward SPUDTs and perform an intermediate operation between a transversal filter and a resonant filter. If, in this structure, the ratio of electrode fingers constituting the forward SPUDT in the transducer to those constituting the backward SPUDT therein is varied, the length of the resonant cavity is varied. As a result, an interval between resonant modes of these filters is changed.

The above-described surface acoustic wave filters A and B each have a triple-mode resonant frequency. Assuming that the resonant frequencies of the surface acoustic wave filter A are Fl1, Fc1 and Fu1 and those of the surface acoustic wave filter B are Fl2, Fc2 and Fu2, the resonant frequencies are expressed as follows:

Fl1<Fl2<Fc2<Fc1<Fu1<Fu2

Figures 3, 4, 5:
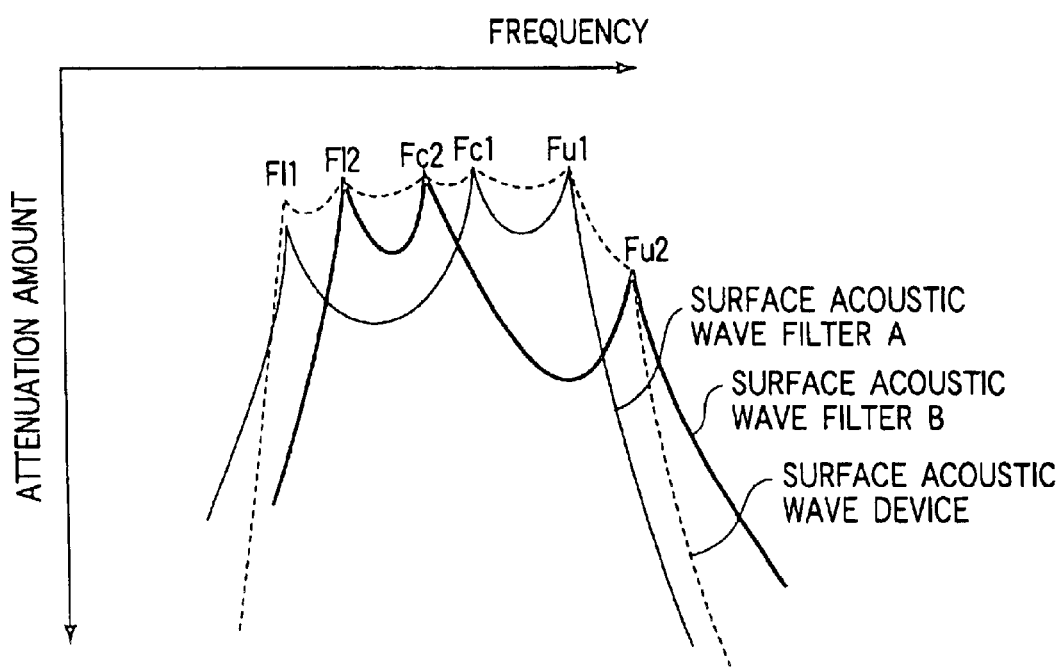
FIG. 3 is a table explaining and showing a phase relationship of resonance frequencies of two surface acoustic wave filters according to the embodiment of the present invention.
FIG. 4 is a table explaining and showing another phase relationship of resonance frequencies of the two surface acoustic wave filters according to the embodiment of the present invention.
FIG. 5 is a graph explaining and showing a frequency characteristic of the surface acoustic wave device according to the embodiment of the present invention.

As shown in FIGS. 3 and 4, the phase of the resonant frequency Fl1 is opposite to that of the resonant frequency Fl2, the phase of the resonant frequency Fc1 is opposite to that of the resonant frequency Fc2, and the phase of the resonant frequency Fu1 is opposite to that of the resonant frequency Fu2.

Furthermore, the resonant frequencies Fl1, Fc1, Fu1, Fl2, Fc2 and Fu2 are set in such a manner that the respective intervals between at least four resonant frequencies are almost equal to each other and the insertion losses of at least four resonant frequencies are almost equal to each other.

A total of six resonant modes consisting of three resonant modes of the surface acoustic wave filter A and three resonant modes of the surface acoustic wave filter B are coupled together. One large frequency band can thus be created as illustrated in FIG. 5.

Since the phases of the surface acoustic wave filters A and B are opposed to each other outside but near the frequency band, the amounts of attenuation are canceled out each other, and the steepness of a skirt characteristic increases more than that in the surface acoustic wave filter A or B alone. If, in this state, the insertion loss levels of the filters A and B are equal to each other, the amounts of attenuation become infinite in the vicinity of the frequency band.

Figure 6:
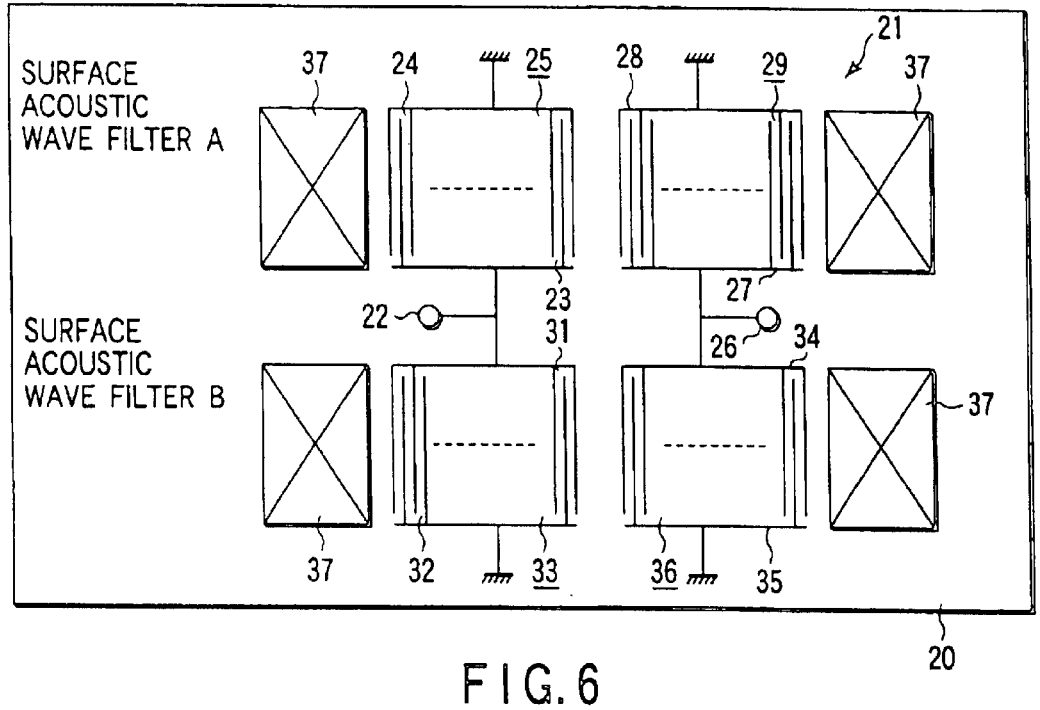
FIG. 6 is a diagram explaining and showing surface acoustic wave devices as comparative examples of the surface acoustic wave device according to the embodiment of the present invention.

FIG. 6 illustrates a surface acoustic wave device 21 including resonant filters connected in parallel and opposite phase, as a comparative example of the surface acoustic wave device 1 shown in FIG. 1.

More specifically, the surface acoustic wave device 21 includes a surface acoustic wave filter A of a first surface acoustic wave element and a surface acoustic wave filter B of a second surface acoustic wave element. These filters A and B are connected in parallel to each other on the same chip.

The surface acoustic wave filter A includes an IDT (Inter Digital Transducer) 25 connected to an input terminal 22 formed on a piezoelectric substrate 20 and an IDT 29 connected to an output terminal 26 formed on the piezoelectric substrate 20.

The IDT 25 is constituted of comb electrodes 23 and 24 crossing each other. The IDT 29 is constituted of comb electrodes 27 and 28 crossing each other.

The surface acoustic wave filter B includes an IDT 33 connected to the input terminal 22 formed on the piezoelectric substrate 20 and an IDT 36 connected to the output terminal 26 formed on the piezoelectric substrate 20.

The IDT 33 is constituted of comb electrodes 31 and 32 crossing each other. The IDT 36 is constituted of comb electrodes 34 and 35 crossing each other.

Each of the surface acoustic wave filters A and B has a reflector 37 on either side thereof.

Figure 7:
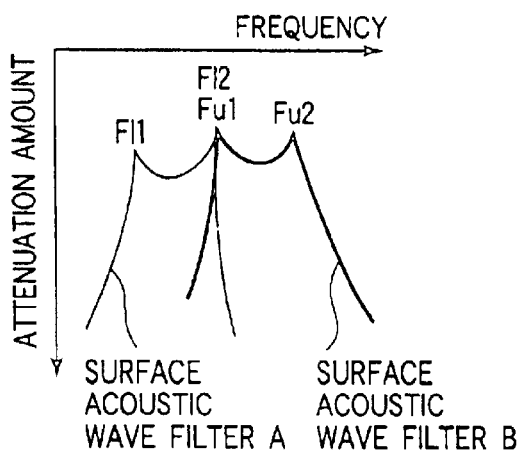
FIG. 7 is a graph explaining and showing a frequency characteristic of each of the surface acoustic wave devices of the comparative examples.
Figure 8:
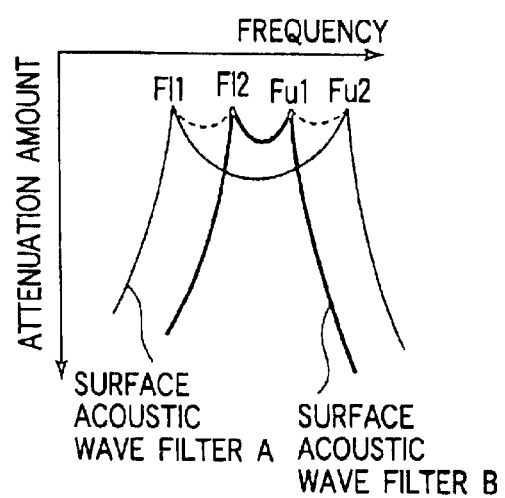
FIG. 8 is a graph explaining and showing another frequency characteristic of each of the surface acoustic wave devices of the comparative examples.

Each of the surface acoustic wave filters A and B has a double-mode resonant frequency characteristic. Even though the resonant frequencies of the surface acoustic wave filter A are Fl1 and Fu1 and those of the surface acoustic wave filter B are Fl2 and Fu2, the frequency characteristic depends only upon the coupling constant and reflectance of the substrate. Unlike the surface acoustic wave device 1 shown in FIG. 1, the device cannot achieve any broadband filters as shown in FIG. 7 or 8.

In the foregoing embodiment, the surface acoustic wave filters A and B are formed on the same chip. If, however, these filters are formed on their different chips, the same advantage can be obtained.

Since the RSPUDT structure is adopted, the out-of-band characteristic can freely be designed by controlling the excitation of the IDT or the reflection distribution by a weight function. The flexibility of the design can be improved more greatly than that in the surface acoustic wave device 21 including resonant filters connected in parallel and opposite phase.

In other words, the device including two acoustic surface wave filters can achieve a broader band than a device including a single acoustic surface wave filter, and obtain a steep skirt characteristic. The band characteristic and out-of-band characteristic can freely be designed, and the size of the device can be decreased.

The following are experimental results of surface acoustic wave filters A and B each having two RSPUDTs that are formed of an aluminum (Al) film on the same piezoelectric substrate as an LBO substrate on which a 210-MHz PCS (Personal Communications System)—IF filter is formed.

Figure 9:
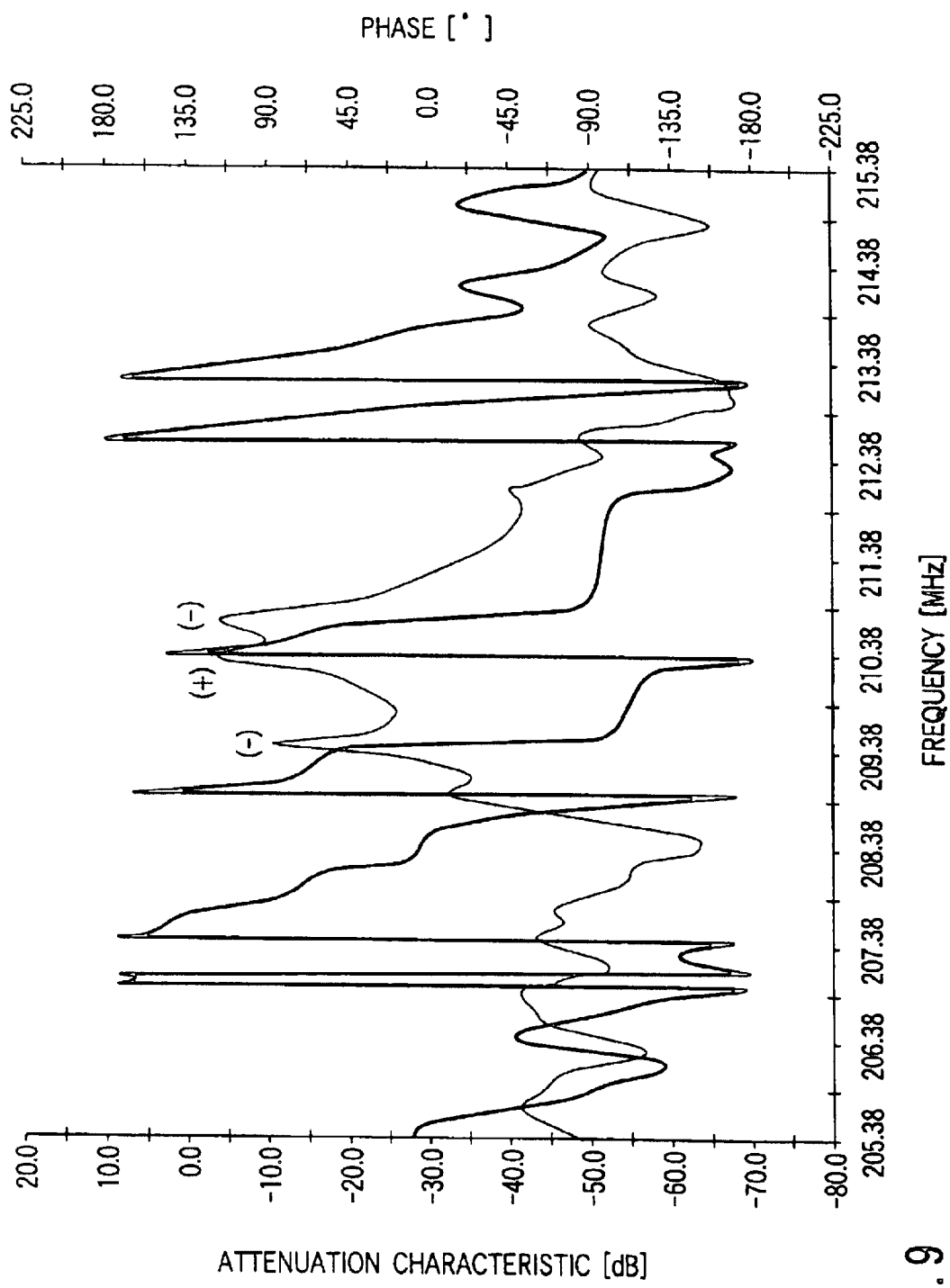
FIG. 9 is a graph explaining and showing a frequency characteristic of one of the surface acoustic wave filters of the surface acoustic wave device according to the embodiment of the present invention.
Figure 10:
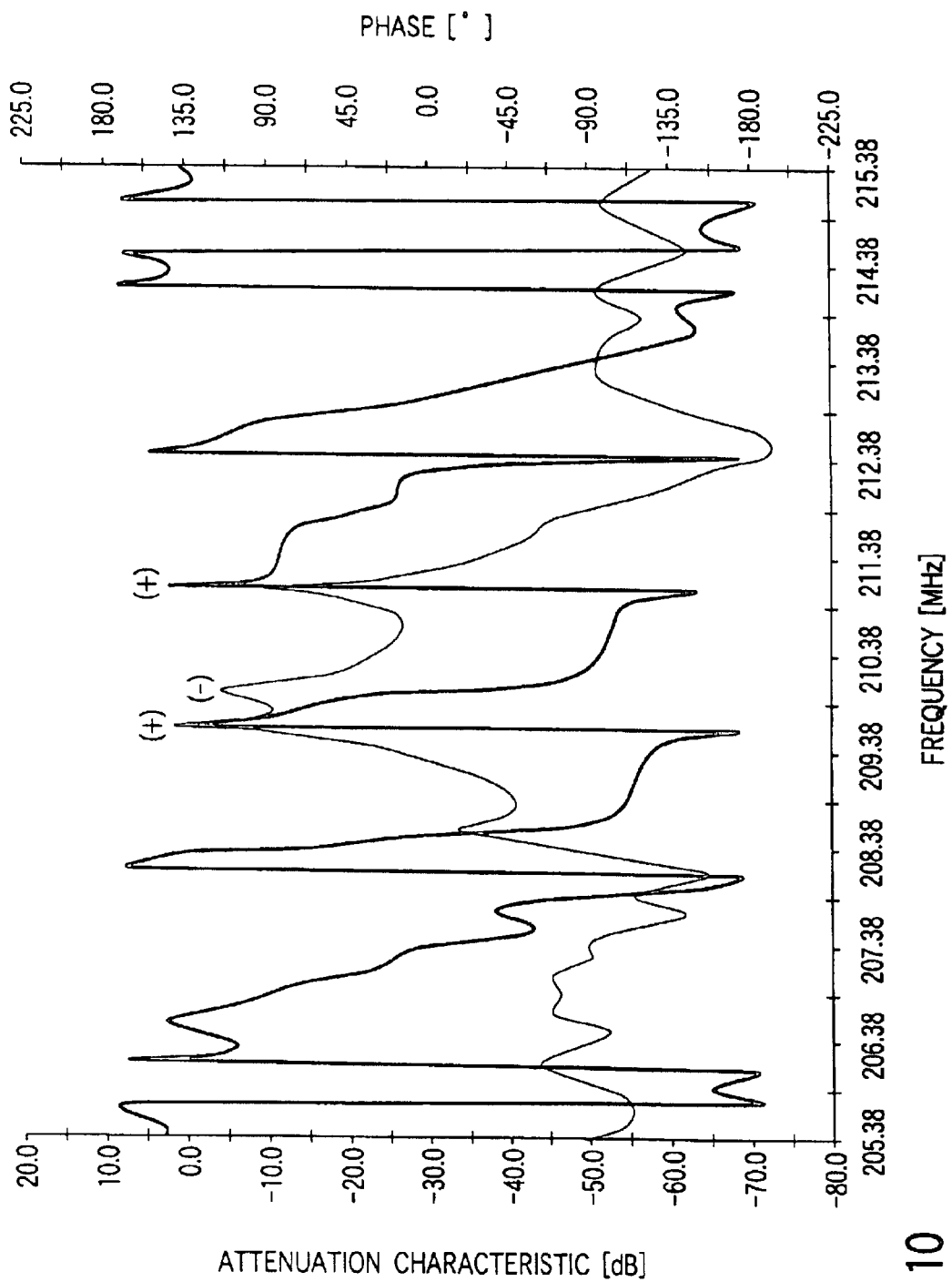
FIG. 10 is a graph explaining and showing a frequency characteristic of the other surface acoustic wave filter of the surface acoustic wave device according to the embodiment of the present invention.

FIG. 9 shows a 50-Ω frequency characteristic of the surface acoustic wave filter A, and FIG. 10 shows a 50-Ω frequency characteristic of the surface acoustic wave filter B.

Figure 11:
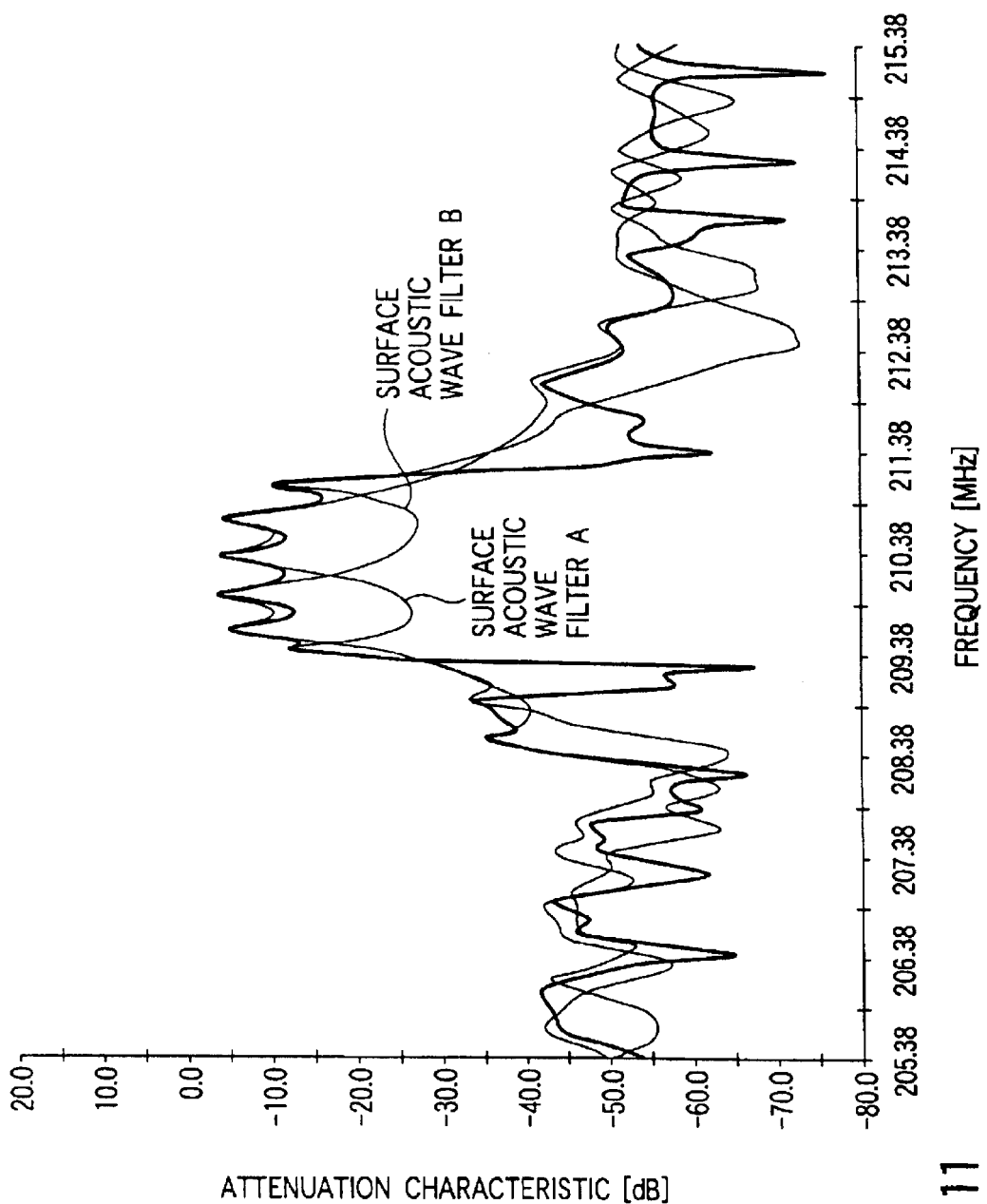
FIG. 11 is a graph explaining and showing a combination of the frequency characteristics of the two surface acoustic wave filters of the surface acoustic wave device according to the embodiment of the present invention.

FIG. 11 shows a frequency characteristic of a combined waveform of the surface acoustic wave filter A with the frequency characteristic shown in FIG. 9 and the surface acoustic wave filter B with the frequency characteristic shown in FIG. 10.

Figure 12:
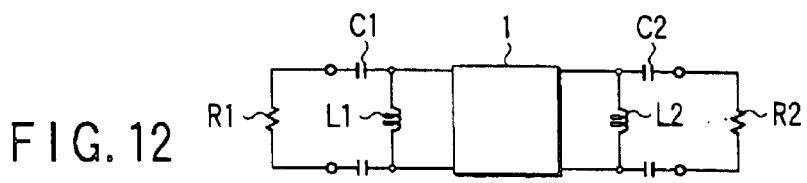
FIG. 12 is a block diagram explaining and showing the surface acoustic wave device according to the embodiment of the present invention, to which an external circuit is connected.

FIG. 12 illustrates the surface acoustic wave device 1 whose input side is connected to an external circuit including a resistor R1, a capacitor C1 and an inductor L1 and whose output side is connected to an external circuit including a resistor R2, a capacitor C2 and an inductor L2 to perform matching.

Figure 13:
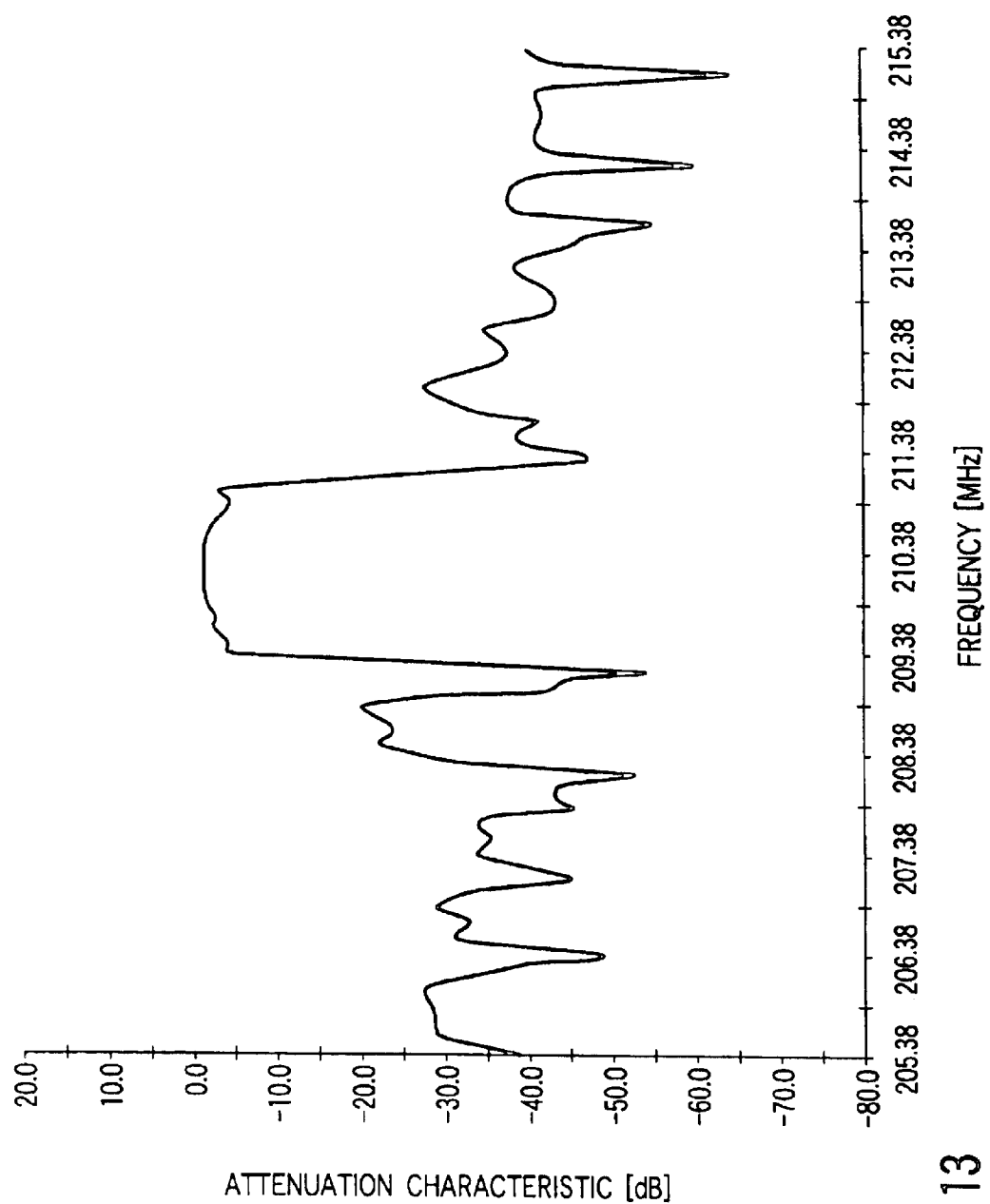
FIG. 13 is a graph explaining and showing a simulated frequency characteristic of the surface acoustic wave device according to the embodiment of the present invention, to which the external device is connected.

If matching is performed as shown in FIG. 12, the simulation of the surface acoustic wave device 1 is given as shown in FIG. 13 and the same frequency characteristic as that shown in FIG. 11 can be obtained.

Figure 14:
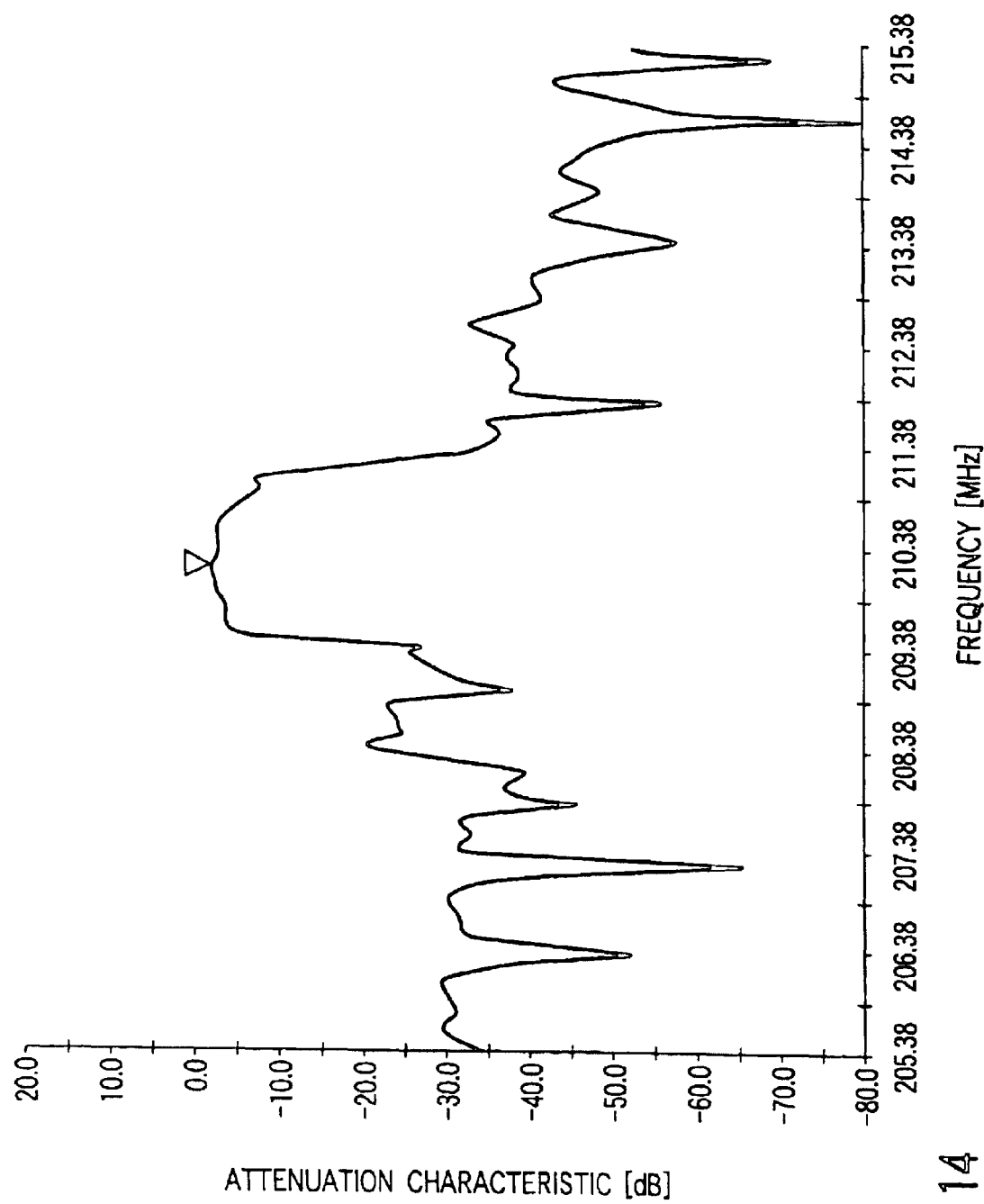
FIG. 14 is a graph explaining and showing the actual frequency characteristic of the surface acoustic wave device according to the embodiment of the present invention, to which the external device is connected.

The actual results correspond to the frequency characteristic as shown in FIG. 14. The same results as the simulation shown in FIG. 13 can be produced.

In the above embodiment, LBO is used for the piezoelectric substrate. However, the same advantage can be obtained even if another piezoelectric substrate is used.

In the foregoing embodiment, an experiment was carried out on an IF filter that requires tuning in an external circuit. However, the same advantage can be produced from a pure-50-Ω driving RF (Radio Frequency) filter.

The present invention is not limited to the above embodiment. Various changes and modifications can be made without departing from the scope of the subject matter of the claimed invention.

According to the foregoing present invention described in detail, a band characteristic is generated from the frequency characteristic of an RSPUDT including a pair of SPUDTs that are so arranged that their propagation directions be opposite to each other. The SPUDTs have a unidirectional electrode structure to provide a propagation characteristic with a directional property.

The bandwidth can freely be controlled by varying the ratio of a comb electrode of an SPUDT having a propagation characteristic in the forward direction to a comb electrode of an SPUDT having a propagation characteristic in the backward direction, or by varying the resonant cavity if the bandwidth falls within a trap defined by the logarithm of the comb electrodes. A steep skirt characteristic can be obtained with a low loss and within a broad band.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A surface acoustic wave device comprising:
a plurality of transducers formed on a piezoelectric substrate including a plurality of regions, each of the regions having a pair of comb electrodes whose surface wave propagation directions are opposite to each other,
wherein at least two of the transducers are connected in parallel and opposite phase to each other and resonant modes of the transducers are coupled to prevent in-phase resonant frequency peaks from conforming to each other.

2. The surface acoustic wave device according to claim 1, wherein each of the transducers has a triple-mode resonant frequency characteristic.

3. The surface acoustic wave device according to claim 1, wherein one of the transducers connected in parallel and another transducer are formed on a single chip.

4. A surface acoustic wave device comprising:
a plurality of transducers formed on a piezoelectric substrate including a plurality of regions, each of the regions having a pair of comb electrodes whose surface wave propagation directions are opposite to each other,
wherein at least two of the transducers are connected in parallel to each other and resonant modes of the transducers are coupled,
wherein each of the transducers has a triple-mode resonant frequency characteristic, and
wherein a first filter including one of the transducers connected in parallel has resonant frequencies of Fl1, Fc1 and Fu1 and a second filter including another transducer has resonant frequencies of Fl2, Fc2, and Fu2, a phase of the resonant frequency Fl1 is opposite to that of the resonant frequency Fl2, a phase of the resonant frequency Fc1 is opposite to that of the resonant frequency Fc2, and a phase of the resonant frequency Fu1 is opposite to that of the resonant frequency Fu2.

5. A surface acoustic wave device comprising:
a plurality of transducers formed on a piezoelectric substrate including a plurality of regions, each of the regions having a pair of comb electrodes whose surface wave propagation directions are opposite to each other,
wherein at least two of the transducers are connected in parallel to each other and resonant modes of the transducers are coupled,
wherein each of the transducers has a triple-mode resonant frequency characteristic, and
wherein a first filter including one of the transducers connected in parallel has resonant frequencies of Fl1, Fc1 and Fu1 and a second filter including another transducer has resonant frequencies of Fl2, Fc2 and Fu2, and respective intervals of at least four resonant frequencies are substantially equal to each other.

6. A surface acoustic wave device comprising:
a plurality of transducers formed on a piezoelectric substrate including a plurality of regions, each of the regions having a pair of comb electrodes whose surface wave propagation directions are opposite to each other,
wherein at least two of the transducers are connected in parallel to each other and resonant modes of the transducers are coupled,
wherein each of the transducers has a triple-mode resonant frequency characteristic, and
wherein a first filter including one of the transducers connected in parallel has resonant frequencies of Fl1, Fc1 and Fu1 and a second filter including another transducer has resonant frequencies of Fl2, Fc2 and Fu2, and insertion losses of at least four of the resonant frequencies are substantially equal to each other.

7. A surface acoustic wave device comprising:
a plurality of transducers formed on a piezoelectric substrate including a plurality of regions, each of the regions having a pair of comb electrodes whose surface wave propagation directions are opposite to each other, wherein at least two of the transducers are connected in parallel to each other and resonant modes of the transducers are coupled, wherein each of the transducers has a triple-mode resonant frequency characteristic, and wherein a first filter including one of the transducers connected in parallel has resonant frequencies of Fl1, Fc1 and Fu1 and a second filter including another transducer has resonant frequencies of Fl2, Fc2 and Fu2, and the resonant frequencies are expressed as follows:

$$Fl1 < Fl2 < Fc2 < Fc1 < Fu1 < Fu2.$$

* * * * *